(12) United States Patent
Yu (10) Patent No.: US 12,407,188 B2
(45) Date of Patent: Sep. 2, 2025

(54) MAGNETIC RESONANCE COUPLING WIRELESS CHARGING DEVICE BASED ON DIFFERENTIAL STRUCTURE

(71) Applicant: Chengdu Xpowerit Technologies Co., Ltd., Chengdu (CN)

(72) Inventor: Yiqiang Yu, Chengdu (CN)

(73) Assignee: Chengdu Xpowerit Technologies Co., Ltd., Chengdu (CN)

( * ) Notice: Subject to any disclaimer, the term of this patent is extended or adjusted under 35 U.S.C. 154(b) by 793 days.

(21) Appl. No.: 17/586,798

(22) Filed: Jan. 28, 2022

(65) Prior Publication Data
US 2022/0247221 A1 Aug. 4, 2022

(30) Foreign Application Priority Data
Feb. 2, 2021 (CN) .......................... 202110141992.X (51) Int. Cl.
*H02J 50/12* (2016.01)
*H03J 3/24* (2006.01)

(52) U.S. Cl.
CPC ................ *H02J 50/12* (2016.02); *H03J 3/24* (2013.01)

(58) Field of Classification Search
CPC ............... H02J 50/12; H02J 50/70; H03J 3/24
See application file for complete search history.

(56) References Cited

U.S. PATENT DOCUMENTS

| 10,454,309 | B2 * | 10/2019 | Byun ..................... H02J 50/80 |
| 11,296,552 | B2 * | 4/2022 | Sit ......................... H02J 50/12 |
| 2017/0155283 | A1 * | 6/2017 | Akuzawa ............... H02J 50/12 |
| 2021/0336483 | A1 * | 10/2021 | Yu ............................ H03F 1/52 |
| 2021/0376644 | A1 * | 12/2021 | Yang ..................... H02J 7/0048 |
| 2024/0291488 | A1 * | 8/2024 | Kumar ............ H03K 19/00369 |
| 2024/0344913 | A1 * | 10/2024 | Yang ....................... G01L 19/08 |
| 2024/0348050 | A1 * | 10/2024 | Lu ....................... H02M 1/4225 |

* cited by examiner

*Primary Examiner* — Nha T Nguyen
(74) *Attorney, Agent, or Firm* — Bayramoglu Law Offices LLC (57) ABSTRACT

A magnetic resonance coupling (MRC) wireless charging device based on a differential structure is provided. The device includes a magnetic resonance transmitter module and a magnetic resonance receiver module communicatively connected to the magnetic resonance transmitter module, where the magnetic resonance transmitter module includes a differential amplifier circuit, a plurality of transmitter-side differential filter circuits, a transmitter-side differential matching circuit and a transmitter coil that are sequentially and communicatively connected; the magnetic resonance receiver module includes a receiver coil, a receiver-side differential matching circuit, a plurality of receiver-side differential filter circuits and a current-doubler rectifier circuit that are sequentially and communicatively connected; and the transmitter coil is communicatively connected to the receiver coil. The MRC wireless charging system based on a differential structure can effectively reduce the overall electromagnetic interference and has a low working voltage and low requirements on withstanding voltages and powers of the devices.

6 Claims, 6 Drawing Sheets

| Coupling distance | Non-differential structure | | Differential structure | |
|---|---|---|---|---|
| | Efficiency | Zin | Efficiency | Zin |
| 2cm | 76.2% | 28.752 | 83.5% | 39.752 |
| 3cm | 84.7% | 42.812 | 85.0% | 41.753 |
| 4cm | 75.1% | 58.336 | 83.8% | 43.336 |
| 5cm | 69.4% | 65.379 | 82.5% | 45.551 |

FIG. 4

| Zin (Real part) / Zin (Imaginary part) | | Center distance in X direction (cm) | | | | | | |
|---|---|---|---|---|---|---|---|---|
| | | -5 | -4 | -2 | 0 | 2 | 4 | 5 |
| Center distance in Y direction (cm) | -5 | 35.7 | 38.4 | 38.6 | 38.9 | 38.4 | 36.9 | 34.8 |
| | | 31.3 | 26.3 | 25.9 | 25 | 25.6 | 29 | 32.7 |
| | -4 | 39.6 | 41.5 | 40.1 | 40.9 | 41.2 | 39.6 | 36.7 |
| | | 23.9 | 18.7 | 19.5 | 20.1 | 19.3 | 23.3 | 29.2 |
| | -2 | 40.1 | 42.1 | 42.3 | 41.6 | 42.1 | 41.2 | 37.6 |
| | | 2.6 | 15.9 | 15.2 | 15.7 | 15.8 | 19.9 | 27.5 |
| | 0 | 37.6 | 41.2 | 42 | 41.8 | 41.5 | 40.7 | 36.5 |
| | | 27.4 | 18.4 | 14.7 | 15 | 15.7 | 18.6 | 28.1 |
| | 2 | 40.1 | 41.7 | 41.9 | 41.9 | 41.6 | 39.8 | 36.4 |
| | | 21.2 | 15.9 | 14.8 | 14.6 | 16.9 | 21.4 | 28.7 |
| | 4 | 39.9 | 41.3 | 41.6 | 41.5 | 41.2 | 40.2 | 36.6 |
| | | 21.5 | 17.4 | 16.2 | 16.2 | 17.3 | 20.3 | 28.2 |
| | 5 | 36 | 37.9 | 39.1 | 38.7 | 38.2 | 36.3 | 30.7 |
| | | 29.7 | 26 | 23.3 | 24.2 | 25 | 28.6 | 36.7 |

FIG. 5

|  | Non-differential structure | | Differential structure | |
|---|---|---|---|---|
| Coupling distance | No-load | On-load | No-load | On-load |
| 2cm | 28.1V | 18.3V | 14.08V | 7.09V |
| 3cm | 25.6V | 16.4V | 12.68V | 6.47V |
| 4cm | 24V | 14V | 12.83V | 6.06V |
| 5cm | 23V | 13.2V | 15.6V | 8.1V |

FIG. 6

| No-load | Center distance in X direction (cm) | | | | | | |
|---|---|---|---|---|---|---|---|
| On-load | -5 | -4 | -2 | 0 | 2 | 4 | 5 |
| -5 | 10.25V | 11.12V | 11.64V | 11.83V | 11.9V | 11.47V | 10.55V |
|  | 6.56V | 6.83V | 7.07V | 7.06V | 7.01V | 6.53V | 6.4V |
| -4 | 11.29V | 12.63V | 13.08V | 13.25V | 13.24V | 12.84V | 11.87V |
|  | 7.06V | 7.95V | 8.05V | 8.17V | 8.47V | 8.06V | 6.85V |
| -2 | 11.74V | 13.09V | 13.53V | 13.59V | 13.24V | 13.24V | 12.15V |
|  | 7.66V | 8.4V | 8.64V | 8.67V | 8.58V | 8.19V | 6.86V |
| 0 | 11.65V | 13.07V | 13.51V | 13.57V | 13.57V | 13.34V | 11.83V |
|  | 7.78V | 8.52V | 8.67V | 8.63V | 8.57V | 8.01V | 6.58V |
| 2 | 11.19V | 12.82V | 13.22V | 13.36V | 13.26V | 12.80V | 11.75V |
|  | 7.21V | 8.04V | 8.35V | 8.44V | 8.53V | 8.15V | 6.66V |
| 4 | 10.75V | 12.18V | 12.52V | 12.77V | 12.55V | 12.05V | 11.17V |
|  | 6.73V | 7.61V | 7.65V | 8.0V | 8.0V | 7.53V | 6.47V |
| 5 | 9.76V | 10.87V | 11.52V | 11.4V | 11.27V | 10.84V | 10.05V |
|  | 6.44V | 6.3V | 6.63V | 6.69V | 6.71V | 6.56V | 6.43V |

(Center distance in Y direction (cm))

MAGNETIC RESONANCE COUPLING WIRELESS CHARGING DEVICE BASED ON DIFFERENTIAL STRUCTURE

CROSS REFERENCE TO THE RELATED APPLICATIONS

This application is based upon and claims priority to Chinese Patent Application No. 202110141992.X, filed on Feb. 2, 2021, the entire contents of which are incorporated herein by reference.

TECHNICAL FIELD

The present disclosure belongs to the technical field of magnetic resonance coupling (MRC) wireless charging, and particularly relates to an MRC wireless charging device based on a differential structure.

BACKGROUND

Due to scientific and technological innovations and the constant development of internet technologies, power supplies are indispensable for widespread applications of consumable electronic products, smart home systems, and Internet of Things (IoT) products. Typically, conventional electrical appliances and electronic devices are powered by wired power supplies directly or by built-in batteries. However, power lines used by the wired power supplies are space-occupying and complicated, with potential safety hazards; and devices powered by the built-in batteries are disadvantageous for short standby time and repeated charging to greatly affect the experience of users. While wireless charging is gaining momentum in various electronic applications, the research on wireless charging and its applications have become new trends for scientific, technological, and academic circles at home and abroad.

Presently, there mainly have been three types of wireless charging technologies, specifically, the quality improvement (QI) standard advocated by the wireless power consortium (WPC) alliance and also called the magnetic inductive coupling, the MRC advocated by the Airfuel alliance, and the electromagnetic radiative wireless energy transfer. The MRC is obviously advantageous over the magnetic induction in charging distance, spatial degree of freedom (DOF), one-to-many charging and power expansion, and more practical than the electromagnetic radiative wireless energy transfer in power conversion efficiency, transmission power and electromagnetic safety. Currently, the MRC has been gradually applied to devices such as smart wearable devices, sweeping robots, automatic guided vehicles (AGVs) and intelligent door locks, to achieve wireless charging functions of the devices, make the devices safer and more intelligent, and improve the experiences of the users. Furthermore, the MRC applied in the intelligent home field will subvert operating modes of conventional household electrical appliances, mobile communication devices and consumable electronic products. With houses as a platform, all power lines in the living areas of homes are removed in combination with the magnetic resonance wireless charging, concealed wiring and automatic control to wirelessly charge the devices or continuously supply power to the devices. The MRC makes the homes safer, more convenient and more comfortable to construct high-efficiency, environment-friendly and energy-saving living environments.

Presently, the devices powered with the MRC wireless charging are obstructed by the low spatial DOF, weak load capacity, high power supply voltage at a transmitter, serious heat dissipation, poor electromagnetic compatibility, and difficulty in establishing application scenarios with low voltage and large current for charging devices. The MRC wireless charging system using a non-differential structure has the following defects:

(1) The MRC wireless charging system is designed based on a principle that the system works in an optimal coupling state. When horizontal positions, angles or coupling distances of a receiver module and a transmitter module change, the MRC wireless charging system using the non-differential structure tends to work in an overcoupling or undercoupling state. In this case, the input impedance Zin of the transmitter-side antenna resonance loop composed of a transmitter coil and a matching circuit changes greatly, and the transmitter-side antenna resonance loop is mismatched significantly with the impedance of the power amplifier circuit in the transmitter module, such that the transmission efficiency and load capacity of the system are reduced dramatically and the working state of the system is unstable.

(2) The MRC wireless charging system using the non-differential structure is biased to a voltage-mode resonance. Under the same output of a load power, the input voltage required by the transmitter module is higher; and when the system works in the overcoupling or undercoupling state, the transmitter module can maintain the output power of the receiver module only by improving a working voltage. As a result, the rectified voltage of the receiver module is further increased, and the receiver module tends to perform an overvoltage protection without the load; and furthermore, with the high working voltage of the transmitter module, overvoltage failure occurs in the power amplifier circuit easily.

(3) Due to large harmonics of the power amplifier circuit, the MRC wireless charging system using the non-differential structure cannot effectively suppress the harmonics and strays of the system until orders of filters are increased. With the high working voltage and high-power output of the transmitter module, the ranges of strays and harmonics of the system are further increased to aggravate the spatial radiation of the system, such that normal work of other systems is affected, and the electromagnetic compatibility of the system cannot meet the requirements in safety standards.

(4) Because of the high working voltages of the transmitter module and the receiver module in the MRC wireless charging system using the non-differential structure, chips need to have a wider range of a working voltage; and consequently, available chips are scarce and expensive, and the material cost of the system is stubbornly high.

SUMMARY

An objective of the present disclosure is to provide an MRC wireless charging device based on a differential structure, to solve the problems of high cost, high working voltage, low load capacity, low spatial DOF, low system transmission efficiency and high electromagnetic interference of the existing wireless charging system using the non-differential structure.

The present disclosure employs the following technical solutions: An MRC wireless charging device based on a differential structure includes a magnetic resonance transmitter module and a magnetic resonance receiver module communicatively connected to the magnetic resonance transmitter module, where the magnetic resonance transmitter module includes a differential amplifier circuit, a plurality of transmitter-side differential filter circuits, a transmitter-side differential matching circuit and a transmitter coil that are sequentially and communicatively connected; the magnetic resonance receiver module includes a receiver coil, a receiver-side differential matching circuit, a plurality of receiver-side differential filter circuits and a current-doubler rectifier circuit that are sequentially and communicatively connected; and the transmitter coil is communicatively connected to the receiver coil.

The present disclosure has the following beneficial effects:

(1) The MRC wireless charging device based on a differential structure can greatly reduce the variation range of the input impedance Zin of the transmitter-side antenna resonance loop composed of the transmitter coil and the matching circuit when the coupling distance and coupling angle between the transmitter coil and the receiver coil as well as the load impedance of the receiver module change. It enables the transmitter-side antenna resonance loop to better match with the output of the power amplifier circuit, increases the DOFs (the horizontal DOFs and angular DOFs) of the magnetic resonance transmitter module, improves the load capacity of the system, and makes the transmitter module and the receiver module work more stably, with a higher transmission efficiency.

(2) The MRC wireless charging device based on a differential structure is biased to the current-mode resonance, which effectively reduces the working voltage of the transmitter module and the rectified voltage of the receiver module. With the current-doubler rectifier circuit in the receiver module, the current output capability of the receiver module is doubled, thus improving the current output capability of the receiver terminal and further reducing the rectified current of the receiver module. And meanwhile, two paths of power amplifier circuits in the transmitter module using the differential structure divert the output power of the system to relieve the heat dissipation.

(3) The MRC wireless charging device based on a differential structure reduces the spatial electromagnetic radiations, strays and leakage fluxes through the denser magnetic fields near the receiver coil and the transmitter coil. With the differential structure, interfering magnetic fields generated by the system can be offset to each other to suppress the even harmonics of the system. The differential filter can effectively filter the odd harmonics of the system to solve the electromagnetic interference.

(4) The MRC wireless charging device based on a differential structure can effectively reduce the overall electromagnetic interference and has a low working voltage and low requirements on withstand voltages and powers of the devices. Therefore, the present disclosure is applied to the MRC wireless charging system with the low voltage, large current and high requirements on the spatial DOF and electromagnetic interference.

Further, the differential amplifier circuit may include inductors L12-L14, inductors L16-L18, ground capacitors C124-C125, a ground capacitor C127, ground capacitors C129-C132, ground capacitors C142-C143, a capacitor C145, ground capacitors C147-C150 and metal oxide semiconductor (MOS) transistors Q20-Q21;

the MOS transistor Q20 may include a gate connected to a differential drive input signal CLK_P and a source grounded; a drain of the MOS transistor Q20 may be respectively connected to one terminal of the inductor L12, the ground capacitor C129, the ground capacitor C130 and one terminal of the inductor L13; the other terminal of the inductor L12 may be respectively connected to the ground capacitor C124 and the ground capacitor C125, with junctions being further connected to a radio-frequency voltage common collector (RFVCC) power supply; the other terminal of the inductor L13 may be connected to one terminal of the capacitor C127; the other terminal of the capacitor C127 may be connected to one terminal of the inductor L14; and the other terminal of the inductor L14 may be respectively connected to the ground capacitor C131 and the ground capacitor C132, with junctions being further connected to the transmitter-side differential filter circuits; and the MOS transistor Q21 may include a gate connected to a differential drive input signal CLK_N and a source grounded; a drain of the MOS transistor Q21 may be respectively connected to one terminal of the inductor L16, the ground capacitor C147, the ground capacitor C148 and one terminal of the inductor L17; the other terminal of the inductor L16 may be respectively connected to the ground capacitor C142 and the ground capacitor C143, with junctions being further connected to the RFVCC power supply; the other terminal of the inductor L17 may be connected to one terminal of the capacitor C145; the other terminal of the capacitor C145 may be connected to one terminal of the inductor L18; and the other terminal of the inductor L18 may be respectively connected to the ground capacitor C149 and the ground capacitor C150, with junctions being further connected to the transmitter-side differential filter circuits.

According to the above further solution of the present disclosure, the differential amplifier circuit in the transmitter module can effectively suppress even harmonics of the system.

Further, the plurality of transmitter-side differential filter circuits each may be structurally identical and include an inductor L15, an inductor L19, a capacitor C126, a capacitor C135, a capacitor C136 and a capacitor C151;

one terminal of the capacitor C135 may be respectively connected to one terminal of the inductor L15, one terminal of the capacitor C126, the other terminal of the inductor L14, the ground capacitor C131 and the ground capacitor C132; and the other terminal of the capacitor C135 may be respectively connected to one terminal of the inductor L19, one terminal of the capacitor C151, the other terminal of the inductor L18, the ground capacitor C149 and the ground capacitor C150; and one terminal of the capacitor C136 may be respectively connected to the other terminal of the inductor L15 and the other terminal of the capacitor C126, with junctions being connected to the transmitter-side differential matching circuit; and the other terminal of the capacitor C136 may be respectively connected to the other terminal of the inductor L19 and the other terminal of the capacitor C151, with junctions being connected to the transmitter-side differential matching circuit.

According to the above further solution of the present disclosure, a better filtering effect is achieved by simultaneously connecting multiple capacitors in parallel.

Further, the transmitter-side differential matching circuit may include a capacitor C128, capacitors C139-C140 and a capacitor C146; and one terminal of the capacitor C128 may be respectively connected to one terminal of the capacitor C139, one terminal of the capacitor C136, the other terminal of the inductor L15 and the other terminal of the capacitor C126; one terminal of the capacitor C139 may be respectively connected to one terminal of the capacitor C146, the other terminal of the capacitor C136, the other terminal of the inductor L19 and the other terminal of the capacitor C151; the other terminal of the capacitor C128 may be connected to one terminal of the capacitor C140, with a junction being connected to a TX_COIL+ terminal of the transmitter coil; and the other terminal of the capacitor C146 may be connected to the other terminal of the capacitor C140, with a junction being connected to a TX_COIL− terminal of the transmitter coil.

According to the above further solution of the present disclosure, the capacitor C140 and the transmitter coil are formed into the parallel resonance, the capacitor C128, the capacitor C146 and the transmitter coil are formed into the series resonance, and the capacitor C135 and the capacitor C136 can be better matched by connecting multiple capacitors in parallel. Through the differential structure for the transmitter-side differential matching circuit, when the coupling distance and coupling angle between the transmitter coil and the receiver coil as well as the receiver-side load impedance change, the variation range of the input impedance Zin of the transmitter-side antenna resonance loop composed of the transmitter coil and the transmitter-side differential matching circuit can be greatly reduced, and the transmitter-side antenna resonance loop is better matched with the output of the power amplifier circuit, such that the overall energy conversion efficiency of the wireless charging system is more stable. In addition, through the differential structure, the system is more biased to a current-mode resonance system, with the denser magnetic fields near the transmitter coil and the receiver coil, smaller leakage fluxes and smaller remaining spatial radiations.

Further, the receiver-side differential matching circuit may include a capacitor C152, a capacitor C156 and a capacitor C161; and one terminal of the capacitor C152 may be connected to one terminal of the capacitor C156, with a junction being connected to an RX_COIL+ terminal of the receiver coil; one terminal of the capacitor C161 may be connected to the other terminal of the capacitor C156, with a junction being connected to an RX_COIL− terminal of the receiver coil; the other terminal of the capacitor C152 may be connected to the receiver-side differential filter circuits; and the other terminal of the capacitor C161 may be connected to the receiver-side differential filter circuits.

According to the above further solution of the present disclosure, the capacitor C156 and the receiver coil are formed into the parallel resonance circuit, the capacitor C152, the capacitor C161 and the receiver coil are formed into the series resonance circuit, and the capacitor C151, the capacitor C156 and the capacitor C161 can be better matched by connecting multiple capacitors in parallel.

Further, the plurality of receiver-side differential filter circuits each may be structurally identical and include inductors L22-L23 and capacitors C162-C165; and one terminal of the capacitor C164 may be respectively connected to one terminal of the inductor L22, one terminal of the capacitor C162 and the other terminal of the capacitor C152; the other terminal of the capacitor C164 may be respectively connected to one terminal of the inductor L23, one terminal of the capacitor C165 and the other terminal of the capacitor C161; one terminal of the capacitor C163 may be respectively connected to the other terminal of the inductor L22 and the other terminal of the capacitor C162, with junctions being connected to the current-doubler rectifier circuit (7); and the other terminal of the capacitor C163 may be respectively connected to the other terminal of the inductor L23 and the other terminal of the capacitor C165, with junctions being connected to the current-doubler rectifier circuit.

According to the above further solution of the present disclosure, both the capacitor C163 and the capacitor C164 can implement the better filtering effect by simultaneously connecting multiple capacitors in parallel; and the differential filter in the receiver module can effectively filter the odd harmonics and strays of the system to reduce the overall electromagnetic interference.

Further, the current-doubler rectifier circuit may include inductors L20-L21, ground capacitors C153-C155, a ground capacitor C160 and diodes D21-D22; and a cathode of the diode D21 may be respectively connected to the ground capacitor C155, one terminal of the inductor L20, one terminal of the capacitor C163, the other terminal of the inductor L22 and the other terminal of the capacitor C162; a cathode of the diode D22 may be respectively connected to the ground capacitor C160, one terminal of the inductor L21, the other terminal of the capacitor C163, the other terminal of the inductor L23 and the other terminal of the capacitor C165; the other terminal of the inductor L20 may be respectively connected to the other terminal of the inductor L21, the ground capacitor C153 and the ground capacitor C154, with junctions being connected to an input terminal VIN of a back-end power supply; and both an anode of the diode D21 and an anode of the diode D22 may be grounded.

According to the above further solution of the present disclosure, adjustments can be made to inductances of the inductor L21 and the inductor L20 and the amplitude of the rectified voltage according to the specific requirement on the load voltage. The current-doubler rectifier circuit in the receiver module can effectively reduce the rectified voltage at the same load power, and enhance the current output capacity of the magnetic resonance receiver module.

In the figures: 1—magnetic resonance transmitter module, 2—magnetic resonance receiver module, 3—differential amplifier circuit, 4—transmitter-side differential filter circuit, 5—transmitter-side differential matching circuit, 6—receiver-side differential matching circuit, 7—current-doubler rectifier circuit, 8—transmitter coil, 9—receiver coil, and 10—receiver-side differential filter circuit.

DETAILED DESCRIPTION OF THE EMBODIMENTS

The present disclosure will be further described below with reference to the accompanying drawings.

To make the solutions of the present disclosure clearer, abbreviations and key terms used herein are defined first before the specific embodiments of the present disclosure are described.

Zin: input impedance of the transmitter-side antenna resonance loop composed of a transmitter coil and a matching circuit.

Figure 1:
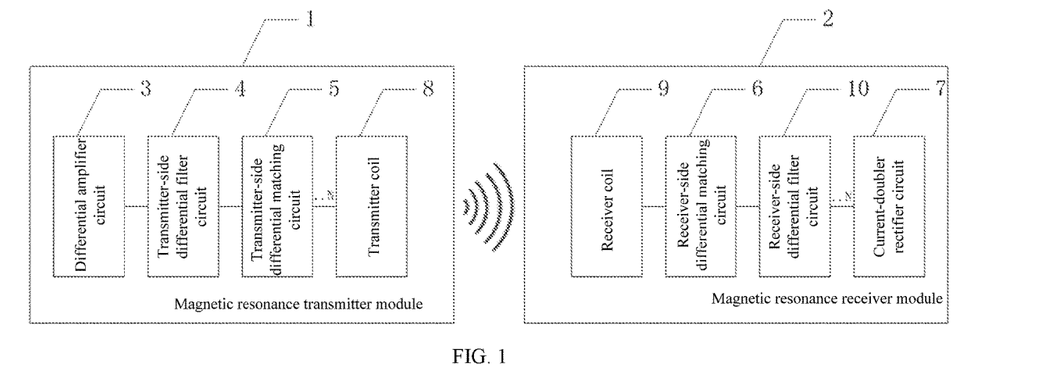
FIG. 1 is a structural view of an MRC wireless charging device.

As shown in FIG. 1, the present disclosure provides an MRC wireless charging device based on a differential structure, including a magnetic resonance transmitter module 1 and a magnetic resonance receiver module 2 communicatively connected to the magnetic resonance transmitter module 1.

The magnetic resonance transmitter module 1 includes a differential amplifier circuit 3, a plurality of transmitter-side differential filter circuits 4, a transmitter-side differential matching circuit 5 and a transmitter coil 8 that are sequentially and communicatively connected; the magnetic resonance receiver module 2 includes a receiver coil 9, a receiver-side differential matching circuit 6, a plurality of receiver-side differential filter circuits 10 and a current-doubler rectifier circuit 7 that are sequentially and communicatively connected; and the transmitter coil 8 is communicatively connected to the receiver coil 9.

Figure 2:
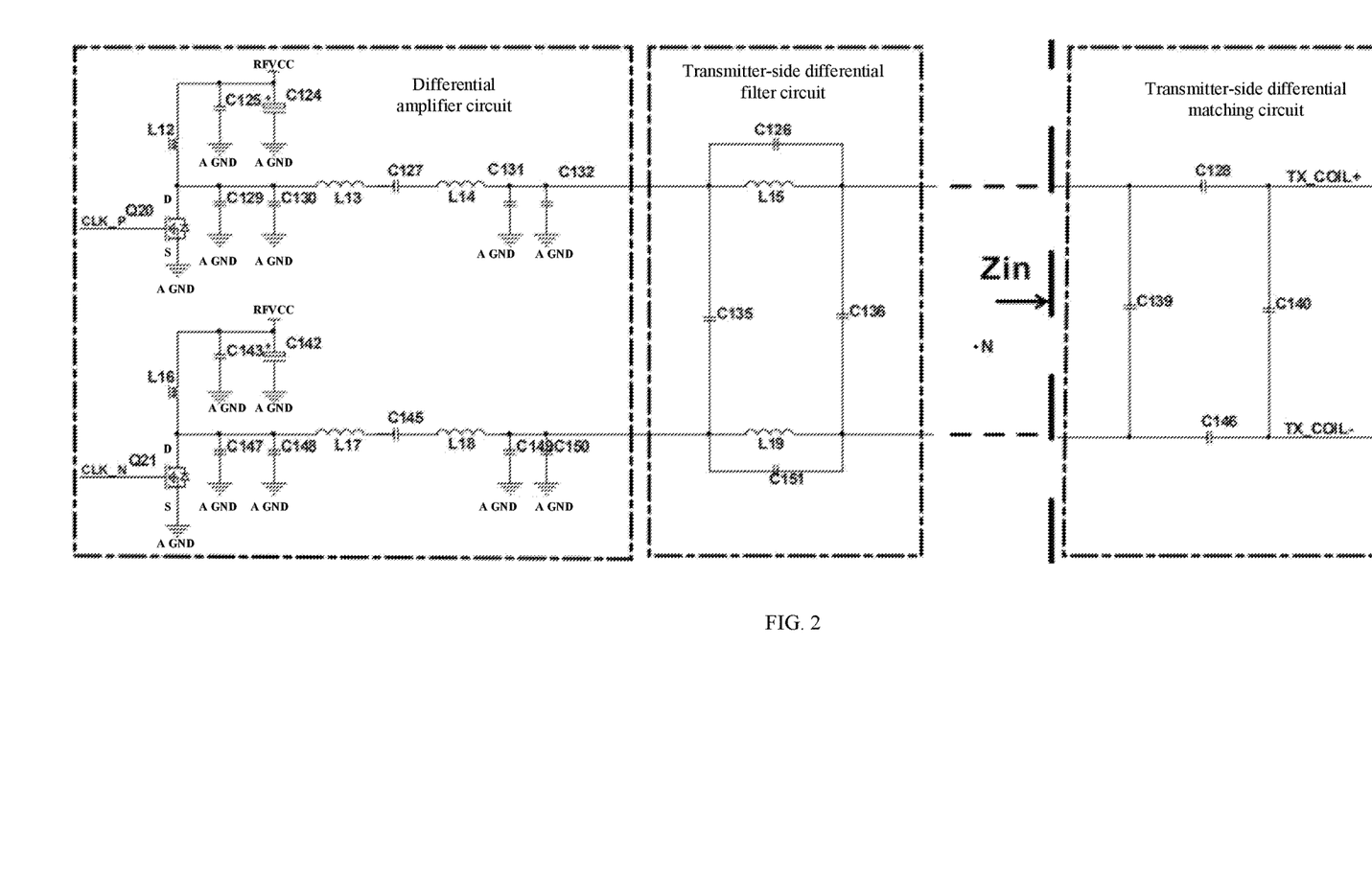
FIG. 2 is a structural view of a magnetic resonance transmitter module.

In the embodiment of the present disclosure, as shown in FIG. 2, the differential amplifier circuit 3 includes inductors L12-L14, inductors L16-L18, ground capacitors C124-C125, a ground capacitor C127, ground capacitors C129-C132, ground capacitors C142-C143, a capacitor C145, ground capacitors C147-C150 and MOS transistors Q20-Q21.

The MOS transistor Q20 includes a gate connected to a differential drive input signal CLK_P and a source grounded; a drain of the MOS transistor Q20 is respectively connected to one terminal of the inductor L12, the ground capacitor C129, the ground capacitor C130 and one terminal of the inductor L13; the other terminal of the inductor L12 is respectively connected to the ground capacitor C124 and the ground capacitor C125, with junctions being further connected to an RFVCC power supply; the other terminal of the inductor L13 is connected to one terminal of the capacitor C127; the other terminal of the capacitor C127 is connected to one terminal of the inductor L14; and the other terminal of the inductor L14 is respectively connected to the ground capacitor C131 and the ground capacitor C132, with junctions being further connected to the transmitter-side differential filter circuits 4.

The MOS transistor Q21 includes a gate connected to a differential drive input signal CLK_N and a source grounded; a drain of the MOS transistor Q21 is respectively connected to one terminal of the inductor L16, the ground capacitor C147, the ground capacitor C148 and one terminal of the inductor L17; the other terminal of the inductor L16 is respectively connected to the ground capacitor C142 and the ground capacitor C143, with junctions being further connected to the RFVCC power supply; the other terminal of the inductor L17 is connected to one terminal of the capacitor C145; the other terminal of the capacitor C145 is connected to one terminal of the inductor L18; and the other terminal of the inductor L18 is respectively connected to the ground capacitor C149 and the ground capacitor C150, with junctions being further connected to the transmitter-side differential filter circuits 4.

According to the present disclosure, the differential amplifier circuit in the transmitter module can effectively suppress even harmonics of the system.

In the embodiment of the present disclosure, as shown in FIG. 2, the plurality of transmitter-side differential filter circuits 4 each are structurally identical and include an inductor L15, an inductor L19, a capacitor C126, a capacitor C135, a capacitor C136 and a capacitor C151.

One terminal of the capacitor C135 is respectively connected to one terminal of the inductor L15, one terminal of the capacitor C126, the other terminal of the inductor L14, the ground capacitor C131 and the ground capacitor C132; and the other terminal of the capacitor C135 is respectively connected to one terminal of the inductor L19, one terminal of the capacitor C151, the other terminal of the inductor L18, the ground capacitor C149 and the ground capacitor C150.

One terminal of the capacitor C136 is respectively connected to the other terminal of the inductor L15 and the other terminal of the capacitor C126, with junctions being connected to the transmitter-side differential matching circuit 5; and the other terminal of the capacitor C136 is respectively connected to the other terminal of the inductor L19 and the other terminal of the capacitor C151, with junctions being connected to the transmitter-side differential matching circuit 5.

According to the present disclosure, a better filtering effect is achieved by simultaneously connecting multiple capacitors in parallel. The number of transmitter-side differential filter circuits depends on actual needs.

In the embodiment of the present disclosure, as shown in FIG. 2, the transmitter-side differential matching circuit 5 includes a capacitor C128, capacitors C139-C140 and a capacitor C146.

One terminal of the capacitor C128 is respectively connected to one terminal of the capacitor C139, one terminal of the capacitor C136, the other terminal of the inductor L15 and the other terminal of the capacitor C126; one terminal of the capacitor C139 is respectively connected to one terminal of the capacitor C146, the other terminal of the capacitor C136, the other terminal of the inductor L19 and the other terminal of the capacitor C151; the other terminal of the capacitor C128 is connected to one terminal of the capacitor C140, with a junction being connected to a TX_COIL+ terminal of the transmitter coil 8; and the other terminal of the capacitor C146 is connected to the other terminal of the capacitor C140, with a junction being connected to a TX_COIL− terminal of the transmitter coil 8.

According to the present disclosure, the capacitor C140 and the transmitter coil are formed into the parallel resonance, the capacitor C128, the capacitor C146 and the transmitter coil are formed into the series resonance, and the capacitor C135 and the capacitor C136 can be better matched by connecting multiple capacitors in parallel. Through the differential structure for the transmitter-side differential matching circuit, when the coupling distance and coupling angle between the transmitter coil and the receiver coil as well as the receiver-side load impedance change, the variation range of the input impedance Zin of the transmitter-side antenna resonance loop composed of the transmitter coil and the transmitter-side differential matching circuit can be greatly reduced, and the transmitter-side antenna resonance loop is better matched with the output of the power amplifier circuit, such that the overall energy conversion efficiency of the wireless charging system is more stable. In addition, through the differential structure, the system is more biased to a current-mode resonance system, with the denser magnetic fields near the transmitter coil and the receiver coil, smaller leakage fluxes and smaller remaining spatial radiations.

Figure 3:
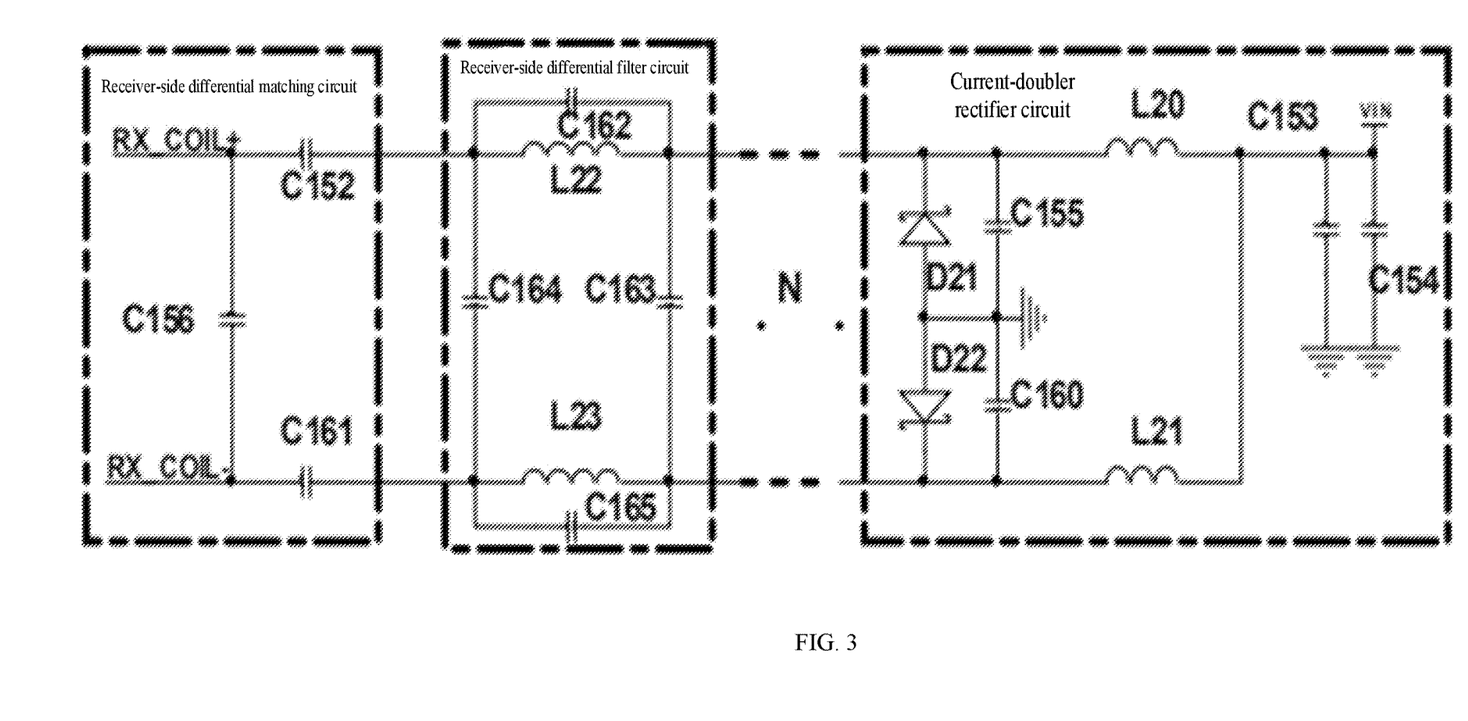
FIG. 3 is a structural view of a magnetic resonance receiver module.

In the embodiment of the present disclosure, as shown in FIG. 3, the receiver-side differential matching circuit 6 includes a capacitor C152, a capacitor C156 and a capacitor C161.

One terminal of the capacitor C152 is connected to one terminal of the capacitor C156, with a junction being connected to an RX_COIL+ terminal of the receiver coil 9; one terminal of the capacitor C161 is connected to the other terminal of the capacitor C156, with a junction being connected to an RX_COIL− terminal of the receiver coil 9; the other terminal of the capacitor C152 is connected to the receiver-side differential filter circuits 10; and the other terminal of the capacitor C161 is connected to the receiver-side differential filter circuits 10.

According to the present disclosure, the capacitor C156 and the receiver coil are formed into the parallel resonance circuit, the capacitor C152, the capacitor C161 and the receiver coil are formed into the series resonance circuit, and the capacitor C151, the capacitor C156 and the capacitor C161 can be better matched by connecting multiple capacitors in parallel.

In the embodiment of the present disclosure, as shown in FIG. 3, the plurality of receiver-side differential filter circuits 10 each are structurally identical and include inductors L22-L23 and capacitors C162-C165.

One terminal of the capacitor C164 is respectively connected to one terminal of the inductor L22, one terminal of the capacitor C162 and the other terminal of the capacitor C152; the other terminal of the capacitor C164 is respectively connected to one terminal of the inductor L23, one terminal of the capacitor C165 and the other terminal of the capacitor C161; one terminal of the capacitor C163 is respectively connected to the other terminal of the inductor L22 and the other terminal of the capacitor C162, with junctions being connected to the current-doubler rectifier circuit 7; and the other terminal of the capacitor C163 is respectively connected to the other terminal of the inductor L23 and the other terminal of the capacitor C165, with junctions being connected to the current-doubler rectifier circuit 7.

According to the present disclosure, both the capacitor C163 and the capacitor C164 can implement the better filtering effect by simultaneously connecting multiple capacitors in parallel. The differential filter in the receiver module can effectively filter the odd harmonics and strays of the system to reduce the overall electromagnetic interference. The number of receiver-side differential filter circuits depends on actual needs.

In the embodiment of the present disclosure, as shown in FIG. 3, the current-doubler rectifier circuit 7 includes inductors L20-L21, ground capacitors C153-C155, a ground capacitor C160 and diodes D21-D22.

A cathode of the diode D21 is respectively connected to the ground capacitor C155, one terminal of the inductor L20, one terminal of the capacitor C163, the other terminal of the inductor L22 and the other terminal of the capacitor C162; a cathode of the diode D22 is respectively connected to the ground capacitor C160, one terminal of the inductor L21, the other terminal of the capacitor C163, the other terminal of the inductor L23 and the other terminal of the capacitor C165; the other terminal of the inductor L20 is respectively connected to the other terminal of the inductor L21, the ground capacitor C153 and the ground capacitor C154, with junctions being connected to an input terminal VIN of a back-end power supply; and both an anode of the diode D21 and an anode of the diode D22 are grounded.

According to the present disclosure, adjustments can be made to inductances of the inductor L21 and the inductor L20 and the amplitude of the rectified voltage according to the specific requirement on the load voltage. The current-doubler rectifier circuit in the receiver module can effectively reduce the rectified voltage at the same load power, and enhance the current output capacity of the magnetic resonance receiver module.

In the embodiment of the present disclosure, the same transmitter coil and receiver coil are used for measurement in FIGS. 4-7, in which the transmitter coil is 20×20 cm, and the receiver coil is 5.5×5.5 cm. The vertical coupling distance is 3 cm for measurement in FIG. 5 and FIG. 7.

Figure 4:
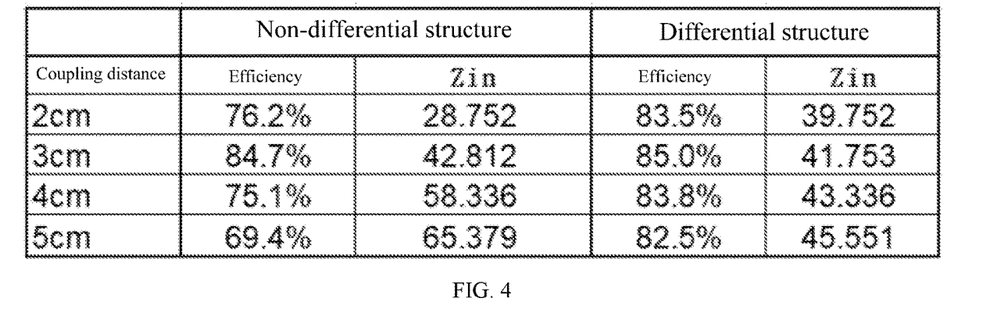
FIG. 4 illustrates a comparison between a differential system and a non-differential system in Zin and an antenna efficiency when a transmitter coil and a receiver coil are aligned at different coupling distances.

As shown in FIG. 4, when the receiver coil and the transmitter coil are centrally aligned at different coupling distances, the variation range of the input impedance Zin of the transmitter-side antenna resonance loop composed of the transmitter coil and the matching circuit is greatly reduced compared with the non-differential structure; and meanwhile, in contrast to the non-differential structure, the coil in the wireless charging system based on the differential structure also has a higher transmission efficiency.

Figure 5:
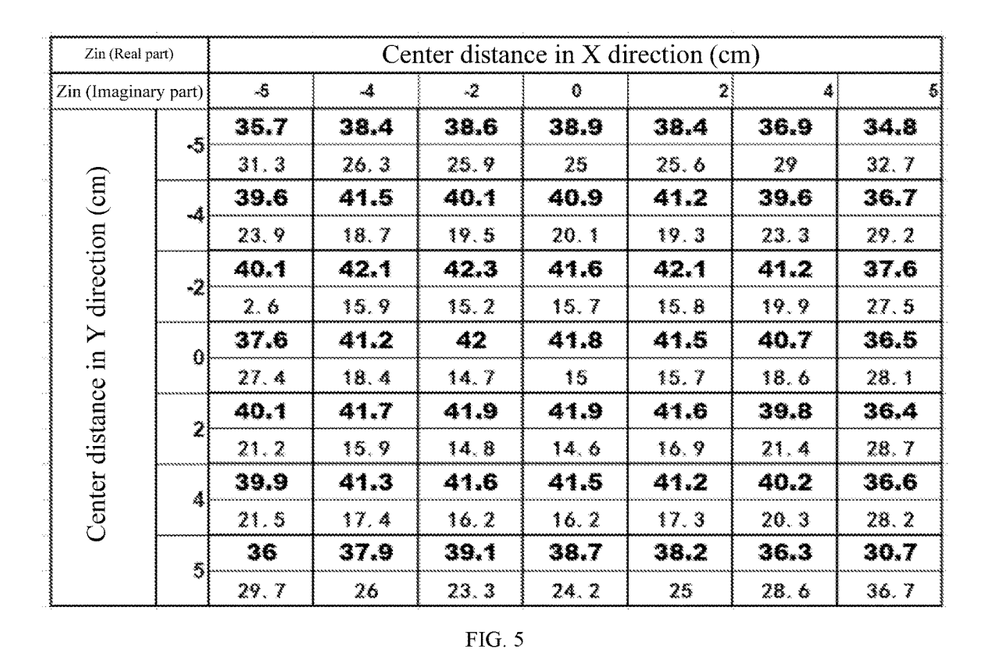
FIG. 5 illustrates a measured value of Zin of a differential system when a transmitter coil and a receiver coil keep a same coupling distance but the receiver coil is located at different horizontal DOFs.

As shown in FIG. 5, when the coupling distance between the receiver coil and the transmitter coil is unchanged but the receiver coil is located at different horizontal positions, the input impedance Zin of the transmitter-side antenna resonance loop composed of the transmitter coil and the matching circuit has a little change.

Figure 6:
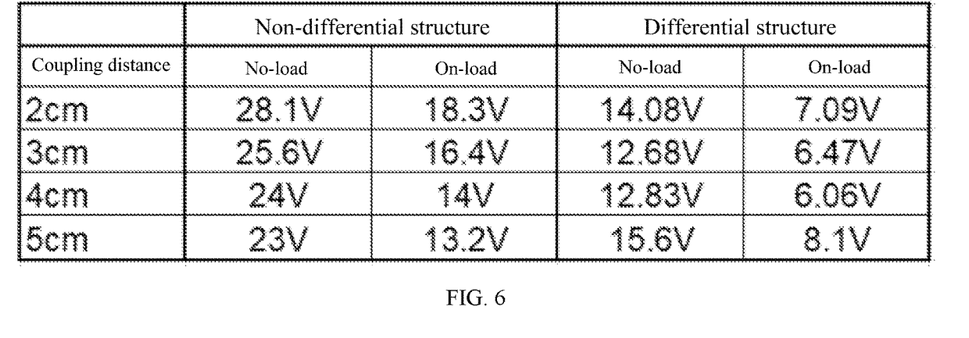
FIG. 6 illustrates a comparison between a differential system and a non-differential system in a rectified voltage under a same coupling distance between a transmitter coil and a receiver coil.

As shown in FIG. 6, when the receiver coil and the transmitter coil are centrally aligned at the same coupling distance, the no-load voltage, on-load voltage and rectified voltage of the magnetic resonance receiver module based on the differential structure are greatly reduced in contrast to the non-differential structure.

Figure 7:
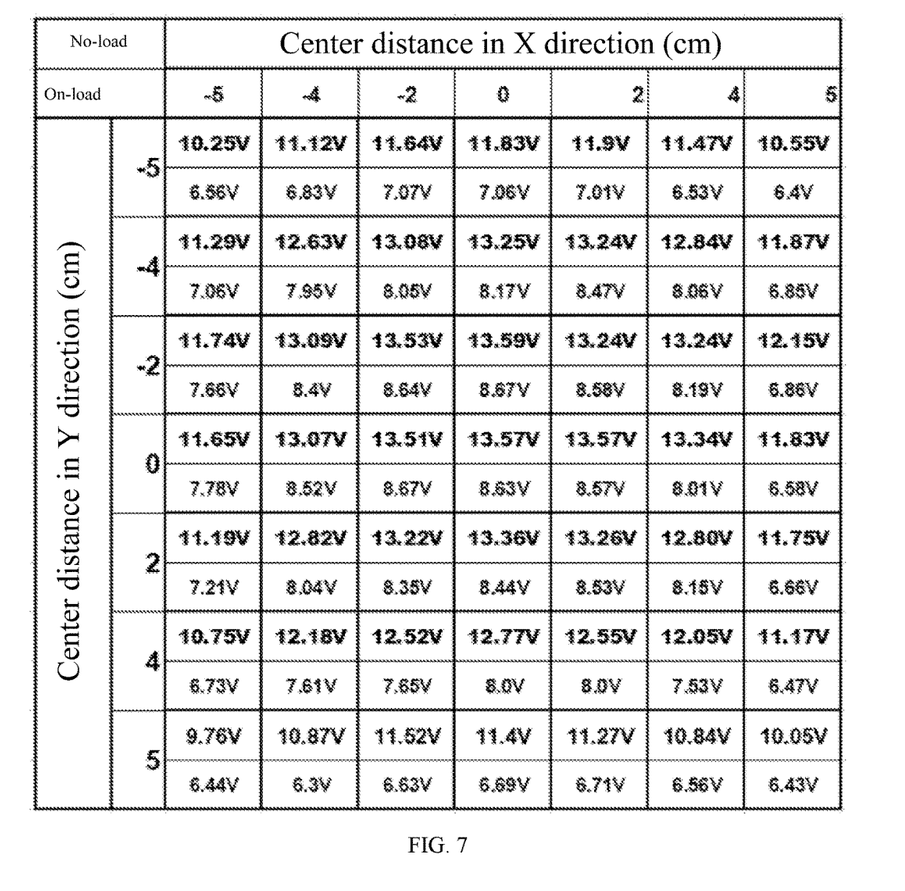
FIG. 7 illustrates measured values of a no-load voltage, an on-load voltage and a rectified voltage of a differential system under a same coupling distance and different horizontal DOFs of a transmitter coil and a receiver coil.

As shown in FIG. 7, when the coupling distance between the receiver coil and the transmitter coil is unchanged but the horizontal position of the receiver coil changes, the no-load voltage, on-load voltage and rectified voltage of the magnetic resonance receiver module based on the differential structure change little.

Figure 8:
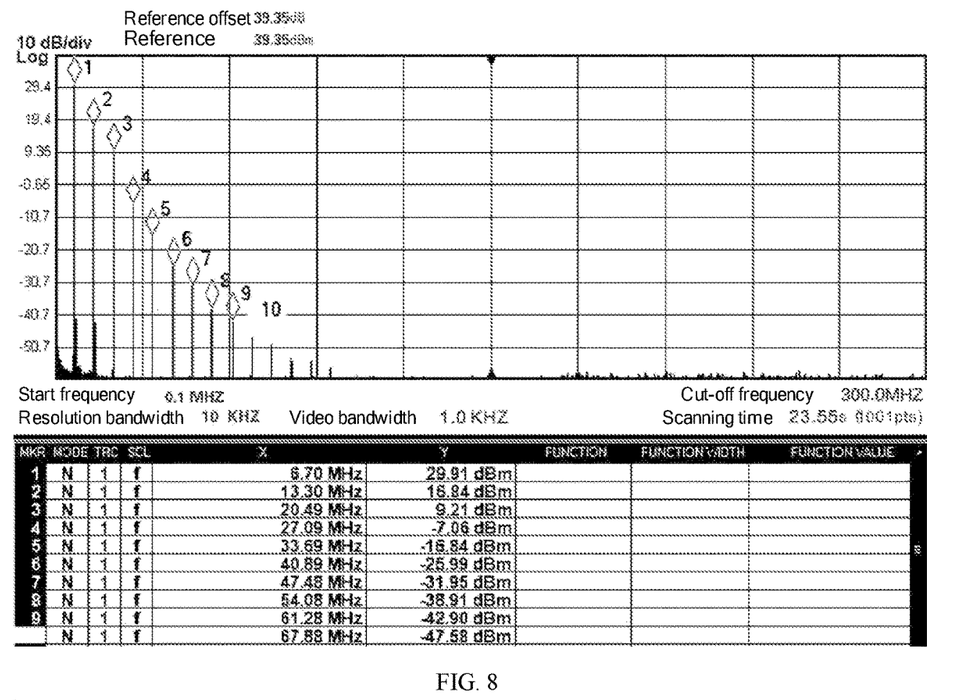
FIG. 8 illustrates a measured value of a harmonic of a transmitter module not using a differential structure.
Figure 9:
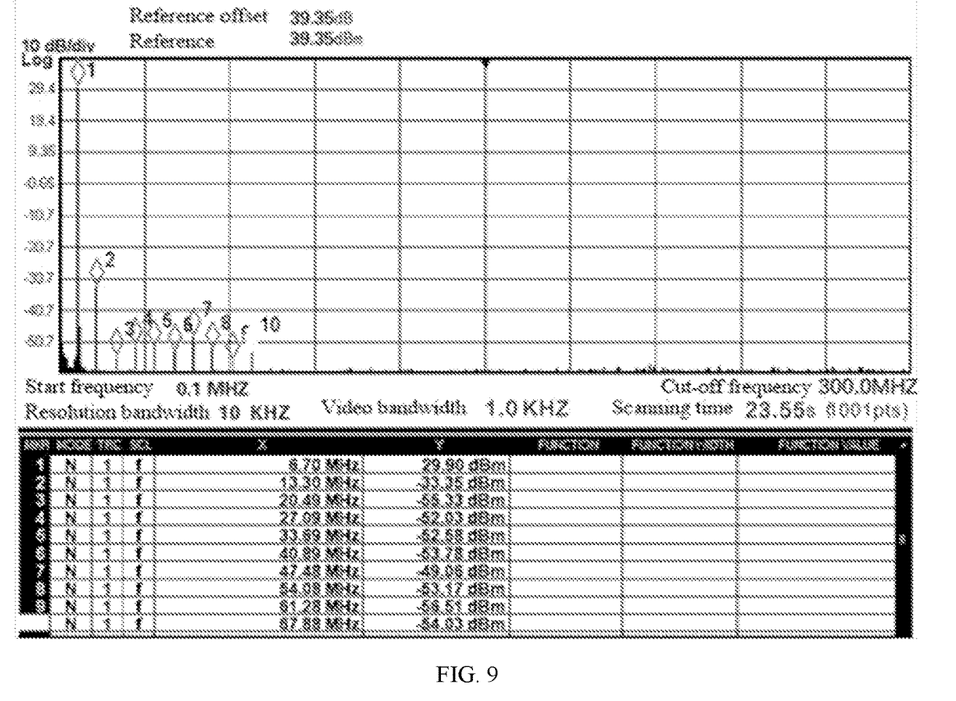
FIG. 9 illustrates a measured value of a harmonic of a transmitter module using a differential structure.

As shown in FIG. 8 and FIG. 9, the MRC wireless charging system based on a differential structure can greatly suppress the harmonics of the system.

The present disclosure has the following working principles and processes: An MRC wireless charging device based on a differential structure provided by the present disclosure includes a magnetic resonance transmitter module 1 and a magnetic resonance receiver module 2, where the magnetic resonance transmitter module 1 includes a differential amplifier circuit 3, transmitter-side differential filter circuits 4, a transmitter-side differential matching circuit 5 and a transmitter coil 8 that are sequentially and communicatively connected; and the magnetic resonance receiver module 2 includes a receiver coil 9, a receiver-side differential matching circuit 6, receiver-side differential filter circuits 10 and a current-doubler rectifier circuit 7 that are sequentially and communicatively connected.

The differential amplifier circuit 3 and the differential matching circuit 5 in the magnetic resonance transmitter module 1 and the receiver-side differential matching circuit 6 in the magnetic resonance receiver module 2 are of the differential structure. When the coupling distance and coupling angle between the transmitter coil and the receiver coil as well as the receiver-side load impedance change, the variation range of the input impedance Zin of the transmitter-side antenna resonance loop composed of the transmitter coil and the transmitter-side differential matching circuit can be greatly reduced, and the transmitter-side antenna resonance loop is better matched with the output of the power amplifier circuit, such that the overall energy conversion efficiency of the wireless charging system is more stable. In addition, through the differential structure, the system is more biased to a current-mode resonance system, with the denser magnetic fields near the transmitter coil and the receiver coil, smaller leakage fluxes and smaller residual space radiations.

The differential amplifier circuit in the magnetic resonance transmitter module 1 can effectively suppress the even harmonics of the system, and the receiver-side differential filter circuit 10 in the magnetic resonance receiver module 2 can effectively filter the odd harmonics and strays of the system, thus reducing the overall electromagnetic interference. The current-doubler rectifier circuit 7 in the magnetic resonance receiver module 2 can effectively reduce the rectified voltage at the same load power, and enhance the current output capability of the resonance receiver module 2. Therefore, the present disclosure is applied to the MRC wireless charging system with the low voltage, large current and high requirements on the spatial DOF and electromagnetic interference.

The present disclosure has the following beneficial effects:

(1) The MRC wireless charging device based on a differential structure can greatly reduce the variation range of the input impedance Zin of the transmitter-side antenna resonance loop composed of the transmitter coil and the matching circuit when the coupling distance and coupling angle between the transmitter coil and the receiver coil as well as the load impedance of the receiver module change. It enables the transmitter-side antenna resonance loop to better match with the output of the power amplifier circuit, increases the DOFs (the horizontal DOFs and angular DOFs) of the magnetic resonance transmitter module, improves the load capacity of the system, and makes the transmitter module and the receiver module work more stably, with a higher transmission efficiency.

(2) The MRC wireless charging device based on a differential structure is biased to the current-mode resonance, which effectively reduces the working voltage of the transmitter module and the rectified voltage of the receiver module. With the current-doubler rectifier circuit in the receiver module, the current output capability of the receiver module is doubled, thus improving the current output capability of the receiver terminal and further reducing the rectified current of the receiver module. And meanwhile, two paths of power amplifier circuits in the transmitter module using the differential structure divert the output power of the system to relieve the heat dissipation.

(3) The MRC wireless charging device based on a differential structure reduces the spatial electromagnetic radiations, strays and leakage fluxes through the denser magnetic fields near the receiver coil and the transmitter coil. With the differential structure, interfering magnetic fields generated by the system can be offset to each other to suppress the even harmonics of the system. The differential filter can effectively filter the odd harmonics of the system to solve the electromagnetic interference.

(4) The MRC wireless charging device based on a differential structure can effectively reduce the overall electromagnetic interference and has a low working voltage and low requirements on withstand voltages and powers of the devices. Therefore, the present disclosure is applied to the MRC wireless charging system with the low voltage, large current and high requirements on the spatial DOF and electromagnetic interference.

Those of ordinary skill in the art will understand that the embodiments described herein are intended to help readers understand the principles of the present disclosure, and it should be understood that the protection scope of the present disclosure is not limited to such special statements and embodiments. Those of ordinary skill in the art may make other various specific modifications and combinations according to the technical teachings disclosed in the present disclosure without departing from the essence of the present disclosure, and such modifications and combinations still fall within the protection scope of the present disclosure.

What is claimed is:

1. A magnetic resonance coupling (MRC) wireless charging device based on a differential structure, comprising a magnetic resonance transmitter module and a magnetic resonance receiver module communicatively connected to the magnetic resonance transmitter module, wherein the magnetic resonance transmitter module comprises a differential amplifier circuit, a plurality of transmitter-side differential filter circuits, a transmitter-side differential matching circuit and a transmitter coil, wherein the differential amplifier circuit, the plurality of transmitter-side differential filter circuits, the transmitter-side differential matching circuit and the transmitter coil are sequentially and communicatively connected;

the magnetic resonance receiver module comprises a receiver coil, a receiver-side differential matching circuit, a plurality of receiver-side differential filter circuits and a current-doubler rectifier circuit, wherein the receiver coil, the receiver-side differential matching circuit, the plurality of receiver-side differential filter circuits and the current-doubler rectifier circuit are sequentially and communicatively connected; and the transmitter coil is communicatively connected to the receiver coil, wherein the differential amplifier circuit comprises a first inductor, a second inductor, a third inductor, a fifth inductor, a sixth inductor, a seventh inductor, a first ground capacitor, a second ground capacitor, a fourth ground capacitor, a sixth ground capacitor, a seventh ground capacitor, an eighth ground capacitor, a ninth ground capacitor, a fourteenth ground capacitor, a fifteenth ground capacitor, a sixteenth capacitor, an eighteenth ground capacitor, a nineteenth ground capacitor, a twentieth ground capacitor, a twenty-first ground capacitor and a first metal oxide semiconductor (MOS) transistor, a second MOS transistor;

the first MOS transistor comprises a gate connected to a first differential drive input signal and a first source grounded; wherein a drain of the first MOS transistor is respectively connected to a first terminal of the first inductor, the sixth ground capacitor, the seventh ground capacitor and a first terminal of the second inductor; a second terminal of the first inductor is respectively connected to the first ground capacitor and the second ground capacitor, with first junctions being further connected to a radio-frequency voltage common collector (RFVCC) power supply; a second terminal of the second inductor is connected to a first terminal of the fourth capacitor; a second terminal of the fourth capacitor is connected to a first terminal of the third inductor; and a second terminal of the third inductor is respectively connected to the eighth ground capacitor and the ninth ground capacitor, with second junctions being further connected to the plurality of transmitter-side differential filter circuits; and the second MOS transistor comprises a gate connected to a second differential drive input signal and a second source grounded; wherein a drain of the second MOS transistor is respectively connected to a first terminal of the fifth inductor, the eighteenth ground capacitor, the nineteenth ground capacitor and a first terminal of the sixth inductor; a second terminal of the fifth inductor is respectively connected to the fourteenth ground capacitor and the fifteenth ground capacitor, with third junctions being further connected to the RFVCC power supply; a second terminal of the sixth inductor is connected to a first terminal of the sixteenth capacitor; a second terminal of the sixteenth capacitor is connected to a first terminal of the seventh inductor; and a second terminal of the seventh inductor is respectively connected to the twentieth ground capacitor and the twenty-first ground capacitor, with fourth junctions being further connected to the plurality of transmitter-side differential filter circuits.

2. The MRC wireless charging device based on the differential structure according to claim 1, wherein each of the plurality of transmitter-side differential filter circuits is structurally identical and comprises a fourth inductor, an eighth inductor, a third capacitor, a tenth capacitor, an eleventh capacitor and a twenty-second capacitor;

a first terminal of the tenth capacitor is respectively connected to a first terminal of the fourth inductor, a first terminal of the third capacitor, the second terminal of the third inductor, the eighth ground capacitor and the ninth ground capacitor; and a second terminal of the tenth capacitor is respectively connected to a first terminal of the eighth inductor, a first terminal of the twenty-second capacitor, the second terminal of the seventh inductor, the twentieth ground capacitor and the twenty-first ground capacitor; and a first terminal of the eleventh capacitor is respectively connected to a second terminal of the fourth inductor and a second terminal of the third capacitor, with fifth junctions being connected to the transmitter-side differential matching circuit; and a second terminal of the eleventh capacitor is respectively connected to a second terminal of the eighth inductor and a second terminal of the twenty-second capacitor, with sixth junctions being connected to the transmitter-side differential matching circuit.

3. The MRC wireless charging device based on the differential structure according to claim 2, wherein the transmitter-side differential matching circuit comprises a fifth capacitor, a twelfth capacitor, a thirteenth capacitor and a seventeenth capacitor; and a first terminal of the fifth capacitor is respectively connected to one terminal of the twelfth capacitor, the first terminal of the eleventh capacitor, the second terminal of the fourth inductor and the second terminal of the third capacitor; the one terminal of the twelfth capacitor is respectively connected to a first terminal of the seventeenth capacitor, the second terminal of the eleventh capacitor, the second terminal of the eighth inductor and the second terminal of the twenty-second capacitor; a second terminal of the fifth capacitor is connected to a first terminal of the thirteenth capacitor, with a seventh junction being connected to a first terminal of the transmitter coil; and a second terminal of the seventeenth capacitor is connected to a second terminal of the thirteenth capacitor, with an eighth junction being connected to a second terminal of the transmitter coil.

4. A magnetic resonance coupling (MRC) wireless charging device based on a differential structure, comprising a magnetic resonance transmitter module and a magnetic resonance receiver module communicatively connected to the magnetic resonance transmitter module, wherein the magnetic resonance transmitter module comprises a differential amplifier circuit, a plurality of transmitter-side differential filter circuits, a transmitter-side differential matching circuit and a transmitter coil, wherein the differential amplifier circuit, the plurality of transmitter-side differential filter circuits, the transmitter-side differential matching circuit and the transmitter coil are sequentially and communicatively connected;

the magnetic resonance receiver module comprises a receiver coil, a receiver-side differential matching circuit, a plurality of receiver-side differential filter circuits and a current-doubler rectifier circuit, wherein the receiver coil, the receiver-side differential matching circuit, the plurality of receiver-side differential filter circuits and the current-doubler rectifier circuit are sequentially and communicatively connected; and the transmitter coil is communicatively connected to the receiver coil, wherein the receiver-side differential matching circuit comprises a twenty-third capacitor, a twenty-seventh capacitor and a twenty-ninth capacitor; and a first terminal of the twenty-third capacitor is connected to a first terminal of the twenty-seventh capacitor, with a ninth junction being connected to a first terminal of the receiver coil; a first terminal of the twenty-ninth capacitor is connected to a second terminal of the twenty-seventh capacitor, with a tenth junction being connected to a second terminal of the receiver coil; a second terminal of the twenty-third capacitor is connected to the plurality of receiver-side differential filter circuits; and a second terminal of the twenty-ninth capacitor is connected to the plurality of receiver-side differential filter circuits.

5. The MRC wireless charging device based on the differential structure according to claim 4, wherein each of the plurality of receiver-side differential filter circuits is structurally identical and comprises an eleventh inductor, a twelfth inductor and a thirtieth capacitor, a thirty-first capacitor, a thirty-second capacitor, a thirty-third capacitor; and
- a first terminal of the thirty-second capacitor is respectively connected to a first terminal of the eleventh inductor, a first terminal of the thirtieth capacitor and the second terminal of the twenty-third capacitor; a second terminal of the thirty-second capacitor is respectively connected to a first terminal of the twelfth inductor, a first terminal of the thirty-third capacitor and the second terminal of the twenty-ninth capacitor; a first terminal of the thirty-first capacitor is respectively connected to a second terminal of the eleventh inductor and a second terminal of the thirtieth capacitor, with eleventh junctions being connected to the current-doubler rectifier circuit; and a second terminal of the thirty-first capacitor is respectively connected to a second terminal of the twelfth inductor and a second terminal of the thirty-third capacitor, with twelfth junctions being connected to the current-doubler rectifier circuit.

6. The MRC wireless charging device based on the differential structure according to claim 5, wherein the current-doubler rectifier circuit comprises a ninth inductor, a tenth inductor, a twenty-fourth ground capacitor, a twenty-fifth ground capacitor, twenty-sixth ground capacitor, a twenty-eighth ground capacitor and a first diode, a second diode; and
- a cathode of the first diode is respectively connected to the twenty-sixth ground capacitor, a first terminal of the ninth inductor, the first terminal of the thirty-first capacitor, the second terminal of the eleventh inductor and the second terminal of the thirtieth capacitor; a cathode of the second diode is respectively connected to the twenty-eighth ground capacitor, a first terminal of the tenth inductor, the second terminal of the thirty-first capacitor, the second terminal of the twelfth inductor and the second terminal of the thirty-third capacitor; a second terminal of the ninth inductor is respectively connected to a second terminal of the tenth inductor, the twenty-fourth ground capacitor and the twenty-fifth ground capacitor, with thirteenth junctions being connected to an input terminal of a back-end power supply; and an anode of the first diode and an anode of the second diode are grounded.

* * * * *